May 1, 1962 A. C. PAULOVITZ 3,031,738
METHOD FOR MOUNTING ELECTRICAL APPARATUS
Filed May 8, 1959

INVENTOR.
ALBERT C. PAULOVITZ

United States Patent Office 3,031,738

Patented May 1, 1962

3,031,738

METHOD FOR MOUNTING ELECTRICAL APPARATUS

Albert C. Paulovitz, Schwenksville, Pa., assignor to Navigation Computer Corporation, a corporation of Pennsylvania Filed May 8, 1959, Ser. No. 811,970
7 Claims. (Cl. 29—155.5)

Figure 1:
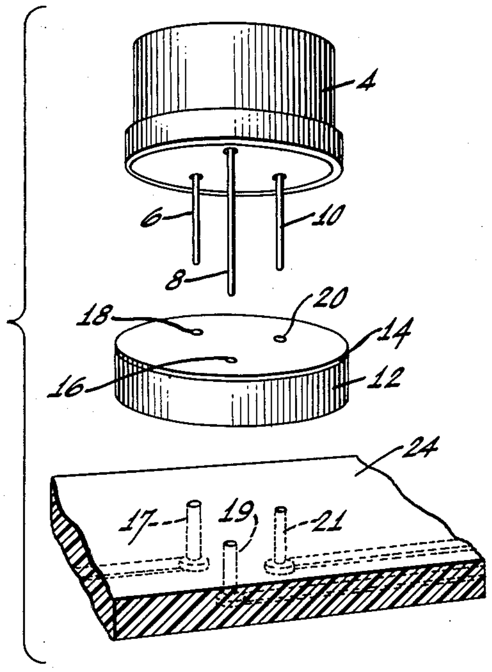

This invention relates to a method of, and apparatus for, mounting electrical apparatus on support panels and in particular to an improved method of and apparatus for the mounting and electrical connection of transistors on printed circuit panels.

The electrical components of many electrical systems are mounted on printed circuit support panels. When transistors are mounted on such panels, special problems are encountered because of the small size and delicate terminal leads of the transistors, and because transistors are easily destroyed by heat. Prior art transistor mountings include an electrical insulating member, usually in the form of a ceramic wafer or disc, which is inserted between the transistor and the support panel. After the transistor and ceramic disc are mounted on the panel, the terminal leads of the transistor are soldered to the appropriate printed circuits on the under-side of the support panel. Unfortunately, however, heat from the soldering operation is conducted directly to the transistor through its external leads. Destruction of the transistor by heat is therefore possible. The use of a ceramic insulating wafer, which is rigid in nature, also creates special problems when it is desired to remove a transistor from the panel. The transistor is removed by unsoldering, one at a time, the connections to the printed circuit panel. The rigidity of the wafers makes it very difficult to apply sufficient leverage to the transistor to free the connections from the panel. Removal of a transistor is thus very time consuming.

It is, therefore, an object of the present invention to provide an improved method of, and apparatus for, mounting electrical components, such as transistors, on support panels wherein adequate heat sinking is provided for the protection of the mounted components.

It is another object of the present invention to provide an improved method of, and apparatus for, mounting transistors on printed circuit panels wherein the transistors may be easily removed from their mounted position.

The apparatus and method embodying the invention includes a pliable and porous felt-like insulating member which separates and electrically insulates the mounted components from the support panel. The felt insulating member is treated by a volatile liquid just prior to the soldering operation. The electrical connections are then soldered. The applied heat causes the volatile liquid, with which the porous insulator has been treated, to boil. Thus, the heat energy is quickly dissipated, preventing damage to the component. This same advantage is obtained when the component (transistor) is removed. In addition, the use of a pliable felt-like insulator (as compared with a rigid ceramic insulator) permits the component to be rocked easily, thus freeing its connection from the support panel when the connections are unsoldered one at a time. Thus, by provision of the invention, spacing and electrical insulation of the component from the panel is provided, adequate heat sinking is obtained, and the components are easily and quickly removed from the panel.

Figure 2:
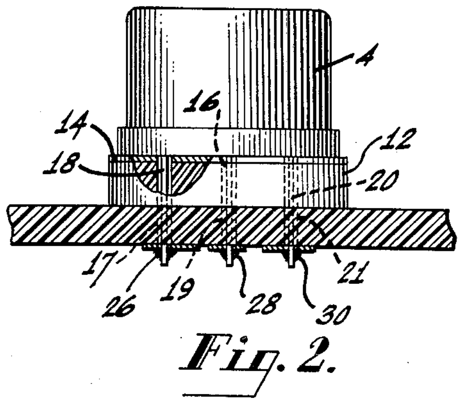

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

FIGURE 1 is an exploded view of a transistor, insulating member, and support panel embodying the invention; and FIGURE 2 is a side elevational view of a transistor mounted on a support panel in accordance with the invention.

Referring now to the drawing, wherein like parts are indicated by the same reference numerals in both figures, and referring particularly to FIG. 1, a transistor 4 includes three leads or wires 6, 8 and 10 which would normally be, in the case of an ordinary junction transistor, the terminal leads for the base, collector and emitter electrodes. A porous insulating member 12 is also provided. The member 12 is made of a pliable material, of which felt is a preferred example. To facilitate the mounting operation, the upper surface of the insulating member is covered by mastic tape 14. Tiny holes 16, 18 and 20 are drilled through the tape and felt layers. These holes are intended to accommodate the terminal leads 6, 8 and 10 of the transistor 4. The use of a mastic surface on the member 12 permits the location of the holes on the tape to be permanently identified. Finally, the apparatus includes a support panel 22, which in the usual case, would be a printed circuit panel. This panel is made of a ceramic or plastic material and includes three holes 17, 19 and 21. The holes drilled in the insulating member 12 are superimposed on the holes in the panel 22 when the apparatus is assembled, thus providing access of the terminal leads 6, 8 and 10 to the bottom surface of the panel 22. This is best shown in the elevational view of FIG. 2.

Just prior to soldering the assembly shown in FIG. 2, the felt insulator 12 is treated by a volatile liquid having a low boiling point. The assembly is then soldered, either manually or by a well known dip-soldering technique, to provide permanent soldered terminal connections 26, 28 and 30 of the transistor leads 6, 8 and 10 to the printed circuitry on the bottom side of the panel 22 (FIG. 2). The heat of the soldering operation is conducted via the transistor leads 6, 8 and 10 and the panel 22 to the porous member 12. The heat causes the liquid, with which the member 12 has been impregnated, to boil. Accordingly, the heat energy is dissipated and never reaches the transistor 4. Thus, the transistor is completely protected against the possible destructive effects of the heat.

Ethyl acetate has been found to be an ideal liquid for treating the insulating member 12 prior to the soldering operation. This liquid has a low boiling point (around 180° F.) and is volatile. Furthermore, it is not electrically conductive and does not, for this reason, destroy the electrical insulating properties of the felt insulator.

If it is necessary, for any reason, to remove a transistor from the support panel, the felt insulator 12 is again treated with the low boiling point liquid. The transistor is thus protected in the manner described above for the initial soldering operation, when heat is applied, as by a soldering iron, to melt the terminal connections 26, 28 and 30. In addition, the use of the felt insulator 12, which is pliable in nature, facilitates the easy removal of the transistor 4 from its mounted position. This is because the pliability of the insulator 12 permits the transistor 4 to be gently rocked to free it from its connections with the panel, as each of the connections is melted in turn. Removal of a transistor is thus a much simpler and faster procedure than in the prior art assemblies, where a rigid insulator was used, making it difficult to supply sufficient leverage to the transistor to remove it from its connection to the support panel.

As described, the important advantages of electrical insulation and spacing, heat sinking, and easy removal of components, are provided in an electrical component and printed circuit assembly embodying the invention.

What is claimed is:

1. The method of mounting electrical apparatus having terminal leads on a support panel having terminal connections comprising the steps of inserting a porous pliable insulating member between said apparatus and said panel, treating said insulating member with a liquid having a relatively low boiling point, and heat fixing said terminal leads to said terminal connections, said liquid providing heat dissipation when said terminal leads are fixed to said terminal connections to protect said apparatus.

2. The method defined in claim 1 wherein said liquid is ethyl acetate.

3. The method of mounting electrical apparatus having terminal leads on a support panel having terminal connections comprising the steps of inserting a felt insulating disc between said apparatus and said panel, treating said felt disc with a liquid having a relatively low boiling point, and heat fixing said terminal leads to said terminal connections, said liquid providing heat dissipation when said terminal leads are fixed to said terminal connections to protect said apparatus.

4. The method of fabricating a transistor-printed circuit electrical assembly, said assembly including a transistor having terminal leads, a printed circuit panel having printed circuits on one surface thereof, and a felt insulating member positioned between said transistor and the opposite surface of said panel, said method comprising the steps of treating said insulating member with a volatile liquid having a relatively low boiling point, and soldering said terminal leads to said printed circuits.

5. The method set forth in claim 4 wherein said liquid is ethyl acetate.

6. The method set forth in claim 4 wherein one surface of said insulating member is covered with mastic tape.

7. The method of fabricating a transistor-printed circuit electrical assembly, said assembly including a transistor having terminal leads, a printed circuit panel having printed circuits on one surface thereof and including holes extending from said surface to the opposite surface to accommodate said leads, and a pliable felt insulating member including holes for accommodating said leads and positioned between said transistor and the opposite surface of said panel, said method comprising the steps of initially treating said insulating member with a liquid having a relatively low boiling point, and subsequently soldering said leads to said printed circuits, said liquid having a boiling point of a value to cause boiling thereof by heat energy conducted through said panel when said leads are soldered to said printed circuits.

References Cited in the file of this patent

UNITED STATES PATENTS

| | | |
|---|---|---|
| 469,897 | Grant et al. | Mar. 1, 1892 |
| 2,007,660 | Piper | July 9, 1935 |
| 2,455,309 | Levin | Nov. 30, 1948 |
| 2,524,939 | Stephen et al. | Oct. 10, 1950 |
| 2,740,193 | Pessell | Apr. 3, 1956 |
| 2,802,995 | Mautone et al. | Aug. 13, 1957 |
| 2,862,294 | Philip | Dec. 2, 1958 |
| 2,947,079 | Schnable | Aug. 2, 1960 |